US008388762B2

(12) United States Patent
Freer et al.

(10) Patent No.: US 8,388,762 B2
(45) Date of Patent: Mar. 5, 2013

(54) SUBSTRATE CLEANING TECHNIQUE EMPLOYING MULTI-PHASE SOLUTION

(75) Inventors: Erik M. Freer, Campbell, CA (US); John M. deLarios, Palo Alto, CA (US); Michael Ravkin, Sunnyvale, CA (US); Mikhail Korolik, San Jose, CA (US); Fritz C. Redeker, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 428 days.

(21) Appl. No.: 11/743,283

(22) Filed: May 2, 2007

(65) Prior Publication Data

US 2008/0271749 A1 Nov. 6, 2008

(51) Int. Cl.
*B08B 3/04* (2006.01)
(52) U.S. Cl. .................. 134/34; 134/7; 134/18
(58) Field of Classification Search ............. 134/7, 25.4, 134/34
See application file for complete search history.

(56) References Cited

U.S. PATENT DOCUMENTS

| | | | |
|---|---|---|---|
| 3,617,095 A | 11/1971 | Lissant | |
| 3,978,176 A | 8/1976 | Voegeli | |
| 4,838,289 A | 6/1989 | Kottman et al. | |
| 5,048,549 A | 9/1991 | Hethcoat | |
| 5,271,774 A | 12/1993 | Leenaars et al. | |
| 5,331,987 A * | 7/1994 | Hayashi et al. | 134/102.1 |
| 5,464,480 A | 11/1995 | Matthews | |
| 5,660,642 A | 8/1997 | Britten | |
| 5,705,223 A | 1/1998 | Bunkofske | |
| 5,858,283 A | 1/1999 | Burris | |
| 5,900,191 A | 5/1999 | Gray et al. | |
| 5,944,582 A | 8/1999 | Talieh | |
| 5,945,351 A | 8/1999 | Mathuni | |
| 5,964,954 A | 10/1999 | Matsukawa et al. | |
| 5,997,653 A | 12/1999 | Yamasaka | |
| 6,081,650 A | 6/2000 | Lyons et al. | |

(Continued)

FOREIGN PATENT DOCUMENTS

| | | |
|---|---|---|
| DE | 40 38 587 A1 | 6/1992 |
| EP | 0905746 A1 | 3/1999 |

(Continued)

OTHER PUBLICATIONS

Hunter, "Introduction to Modern Colloid Science," Oxford University Press, Feb. 1994.

(Continued)

*Primary Examiner* — Michael Kornakov
*Assistant Examiner* — Natasha Campbell
(74) *Attorney, Agent, or Firm* — Martine Penilla Group, LLP

(57) ABSTRACT

A method and system for cleaning opposed surfaces of a semiconductor wafer having particulate matter thereon. The method includes generating relative movement between a fluid and the substrate. The relative movement is in a direction that is transverse to a normal to one of the opposed surfaces and creates two spaced-apart flows. Each of the flows is adjacent to one of the opposed surfaces that is different from the opposed surface that is adjacent to the remaining flow of the plurality of flows. The fluid has coupling elements entrained therein, and the relative movement is established to impart sufficient drag upon a subset of the coupling elements to create movement of the coupling elements of the subset within the fluid. In this manner, a quantity of the drag is imparted upon the particulate matter to cause the particulate matter to move with respect to the substrate.

18 Claims, 11 Drawing Sheets

U.S. PATENT DOCUMENTS

| | | | |
|---|---|---|---|
| 6,090,217 A | 7/2000 | Kittle | |
| 6,152,805 A | 11/2000 | Takahashi | |
| 6,167,583 B1 | 1/2001 | Miyashita et al. | |
| 6,171,403 B1 * | 1/2001 | Kamikawa et al. | 134/2 |
| 6,228,563 B1 | 5/2001 | Starov et al. | |
| 6,267,125 B1 | 7/2001 | Bergman et al. | |
| 6,272,712 B1 | 8/2001 | Gockel et al. | |
| 6,276,459 B1 | 8/2001 | Herrick et al. | |
| 6,290,780 B1 | 9/2001 | Ravkin | |
| 6,386,956 B1 | 5/2002 | Sato et al. | |
| 6,398,975 B1 | 6/2002 | Mertens et al. | |
| 6,401,734 B1 | 6/2002 | Morita et al. | |
| 6,439,247 B1 | 8/2002 | Kittle | |
| 6,457,199 B1 | 10/2002 | Frost et al. | |
| 6,491,764 B2 | 12/2002 | Mertens et al. | |
| 6,493,902 B2 | 12/2002 | Lin | |
| 6,594,847 B1 | 7/2003 | Krusell et al. | |
| 6,616,772 B2 | 9/2003 | de Larios et al. | |
| 6,797,071 B2 | 9/2004 | Kittle | |
| 6,802,911 B2 | 10/2004 | Lee et al. | |
| 6,810,105 B2 | 10/2004 | Nasser-Ghodsi et al. | 378/44 |
| 6,846,380 B2 | 1/2005 | Dickinson et al. | |
| 6,851,435 B2 | 2/2005 | Mertens et al. | |
| 6,874,516 B2 | 4/2005 | Matsuno et al. | |
| 7,122,126 B1 | 10/2006 | Fuentes | |
| 2002/0092614 A1 * | 7/2002 | Huang et al. | 156/345.18 |
| 2002/0094684 A1 | 7/2002 | Hirasaki et al. | |
| 2002/0121290 A1 | 9/2002 | Tang et al. | |
| 2002/0185164 A1 | 12/2002 | Tetsuka et al. | |
| 2003/0159713 A1 * | 8/2003 | Park et al. | 134/2 |
| 2003/0171239 A1 | 9/2003 | Patel et al. | |
| 2003/0226577 A1 | 12/2003 | Orll et al. | |
| 2004/0053808 A1 | 3/2004 | Raehse et al. | |
| 2004/0261823 A1 | 12/2004 | de Larios | |
| 2005/0132515 A1 | 6/2005 | Boyd et al. | |
| 2005/0133060 A1 | 6/2005 | de Larios et al. | |
| 2005/0133061 A1 | 6/2005 | de Larios et al. | |
| 2006/0128590 A1 | 6/2006 | Freer et al. | 510/417 |
| 2006/0128600 A1 * | 6/2006 | Freer et al. | 510/491 |
| 2006/0196530 A1 * | 9/2006 | Hung et al. | 134/110 |
| 2006/0201267 A1 | 9/2006 | Liu | |
| 2006/0283486 A1 | 12/2006 | de Larios et al. | |
| 2006/0285930 A1 | 12/2006 | Korolik et al. | |
| 2007/0000518 A1 | 1/2007 | de Larios et al. | |

FOREIGN PATENT DOCUMENTS

| | | |
|---|---|---|
| JP | 5924849 | 2/1984 |
| JP | 62119543 | 5/1987 |
| JP | 5-15857 | 1/1993 |
| JP | 11 334874 | 12/1999 |
| JP | 11350169 | 12/1999 |
| JP | 2002-66475 | 3/2002 |
| JP | 2002 280330 | 9/2002 |
| JP | 2002-309638 | 10/2002 |
| KR | 10-1997-0077292 | 12/1997 |
| WO | WO 99/16109 | 4/1999 |
| WO | WO 00/33980 | 6/2000 |
| WO | WO 00/59006 | 10/2000 |
| WO | WO 01/12384 A2 | 2/2001 |
| WO | WO 02/101795 | 12/2002 |
| WO | WO 2005/006424 | 1/2005 |
| WO | WO 2006/106045 * | 10/2006 |

OTHER PUBLICATIONS

Weaire et al, "The Physics of Foams," Department of Physics, Trinity College, Dublin, 1999.

Lester, M.A., "Is Foam Wafer Cleaning and Drying the Future?" <htttp://www.aquafoam.com/papers/SCI0202.pdf>, Semiconductor International, 25, #2 (Feb.), 42 (2002).

Kittle, P.A., "Particulate Removal Using a Foam Medium," http://www.aquafoam.Com/papers/particulate.pdf>, Jan. 2002.

Kittle et al., "Photoresist Removal Using Aqueous Foam," http://www.aquafoam.com/papers/A2C2photoresist.pdf, 2001.

Kittle, P.A., "Aqueous Foam Drying and Cleaning of Semiconductor Wafers," http://www.aquafoam.com/papers/SCCPresentation.pdf>, Apr. 2004.

Kittle, "Removing Particles with Foam Medium," <http://www.aquafoam.com/papers/A2C2foammedium.pdf>, A2C2, p. 11-15, Jan. 2002.

Kittle, P.A., "Semiconductor Wafer Cleaning and Drying Using a Foam Medium," http://www.aquafoam.com/papers/NWCWG.pdf>, Sematech Novel Wafer Cleans Working Group Meeting Internet Presentation, Nov. 13, 2001.

Kittle et al., "Photoresist Residue Removal Using Aqueous Foam Proof of Concept Experiments," <http://www.aquafoam.com/papers/Removalall.pdf>, <papers/A2C2Pphotoresist.pdf>, pp. 13-17, May 2002.

Kirkpatrick et al., "Advanced Wafer-Cleaning Evolution," Solid State Technology, May 2003, www.solid-state.com.

Lide, "Air Composition," CRC Handbook of Chemistry and Physics, 1997.

U.S. Appl. No. 11/639,752, filed on Dec. 15, 2006, Boyd et al.

U.S. Appl. No. 11/543,365, filed on Nov. 4, 2006, Freer et al.

* cited by examiner

SUBSTRATE CLEANING TECHNIQUE EMPLOYING MULTI-PHASE SOLUTION

CROSS REFERENCE TO RELATED APPLICATIONS

This application is related to U.S. patent application Ser. No. 10/608,871, filed Jun. 27, 2003, and entitled "Method and Apparatus for Removing a Target Layer from a Substrate Using Reactive Gases"; U.S. patent application Ser. No. 10/816,337, now U.S. Pat. No. 7,441,299 filed on Mar. 31, 2004, and entitled "Apparatuses and Methods for Cleaning a Substrate"; U.S. patent application Ser. No. 11/173,132, now U.S. Pat. No. 7,452,408 filed on Jun. 30, 2005, and entitled "System and Method for Producing Bubble Free Liquids for Nanometer Scale Semiconductor Processing"; U.S. patent application Ser. No. 11/153,957, now U.S. Pat. No. 8,043,441 filed on Jun. 15, 2005, and entitled "Method and Apparatus for Cleaning a Substrate Using Non-Newtonian Fluids"; U.S. patent application Ser. No. 11/154,129, now U.S. Pat. No. 7,416,370 filed on Jun. 15, 2005, and entitled "Method and Apparatus for Transporting a Substrate Using Non-Newtonian Fluid"; U.S. patent application Ser. No. 11/174,080, filed on Jun. 30, 2005, and entitled "Method for Removing Material from Semiconductor Wafer and Apparatus for Performing the Same"; U.S. patent application Ser. No. 10/746,114, now U.S. Pat. No. 7,568,490 filed on Dec. 23, 2003, and entitled "Method and Apparatus for Cleaning Semiconductor Wafers using Compressed and/or Pressurized Foams, Bubbles, and/or Liquids"; U.S. patent application Ser. No. 11/336,215 now U.S. Pat. No. 7,648,584 filed on Jan. 20, 2006, and entitled "Method and Apparatus for Removing Contamination from Substrate"; U.S. patent application Ser. No. 11/346,894, now U.S. Pat. No. 7,737,097 filed on Feb. 3, 2006, and entitled "Method for Removing Contamination From a Substrate and for Making a Cleaning Solution"; U.S. patent application Ser. No. 11/347,154 now U.S. Pat. No. 7,696,141 filed on Feb. 3, 2006, and entitled "Cleaning Compound and Method and System for Using the Cleaning Compound"; U.S. patent application Ser. No. 11/543,365, filed on Oct. 4, 2006, and entitled "Method and Apparatus for Particle Removal"; and U.S. patent application Ser. No. 11/732,603, filed on Apr. 3, 2007, and entitled "Method for Cleaning Semiconductor Wafer Surfaces by Applying Periodic Shear Stress to the Cleaning Solution". The disclosure of each of these related applications is incorporated herein by reference for all purposes.

BACKGROUND

There exists a desire to reduce critical dimensions of features in electronic substrate products. As the features decrease in size, the impact of contaminants during processing of the features increases, which may produce defects. Exemplary contaminants are particulates that include polysilicon slivers, photoresist particles, metal oxide particles, metal particles, slurry residue, dust, dirt, as well as various molecules containing atoms such as carbon, hydrogen, and/or oxygen. Particulates frequently adhere to a substrate surface by weak covalent bonds, electrostatic forces, van der Waals forces, hydrogen bonding, coulombic forces, or dipole-dipole interactions, making removal of the particulates difficult.

Historically, particulate contaminants have been removed by a combination of chemical and mechanical processes. These processes employ cleaning tools and agents that have a probability of introducing additional contaminants during a cleaning process.

Another technique for cleaning a substrate surface omits the use of chemical agents by exposing the surface to high heat to vaporize contaminants present thereon. The vapors are removed by evacuating a chamber in which the substrate surface is present. The high temperatures required for this process limits its application to post deposition processes not involving material having a structure that varies at temperatures proximate to the vaporization temperature of the contaminants.

Another cleaning technique is disclosed in U.S. Pat. No. 6,881,687 and employs a laser-clean yield-enabling system. The system incorporates a laser cleaning operation working in conjunction with a defect inspection operation cooperating to feed information regarding the root cause of remaining defects back to earlier process stages, for correction of the root causes, with resultant improvement in yield. In a simplest configuration, the particles remaining after a laser cleaning would be characterized as to their types, sizes, shapes, densities, locations, and chemical compositions in order to deduce the root causes of the presence of those particular particles. This information is used to improve the yield of subsequent product wafers being processed so that their yields are higher than the wafers characterized. It is desired, however, to provide a more robust cleaning process that avoids the presence of particulate contaminants remaining on the surface that has been subjected to a cleaning process.

Therefore, a need exists to provide improved techniques to clean substrate surfaces.

SUMMARY OF THE INVENTION

A method and system for cleaning opposed surfaces of a semiconductor substrate having contaminants thereon. In one embodiment the method includes concurrently generating relative movement between a plurality substrates and a solution by exposing a cassette having the substrates contained therein to the solution. The solution has coupling elements entrained therein and the relative movement imparts sufficient drag upon a subset of the coupling elements to create movement of the coupling elements of the subset within the solution and impart a quantity of the drag upon the contaminant to cause the contaminant to move with respect to the substrate.

Another embodiment is directed to a method that includes generating relative movement between a fluid and the substrate. The relative movement is in a direction that is transverse to a normal to one of the opposed surfaces and creates two spaced-apart flows. Each of the flows is adjacent to one of the opposed surfaces that is different from the opposed surface that is adjacent to the remaining flow of the plurality of flows. The fluid has coupling elements entrained therein, and the relative movement is established to impart sufficient drag upon the contaminants with to move the contaminants with respect to the substrate. Other aspects and advantages of the invention will become more apparent from the following detailed description, taken in conjunction with the accompanying drawings, illustrating by way of example the present invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE INVENTION

In the following description numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
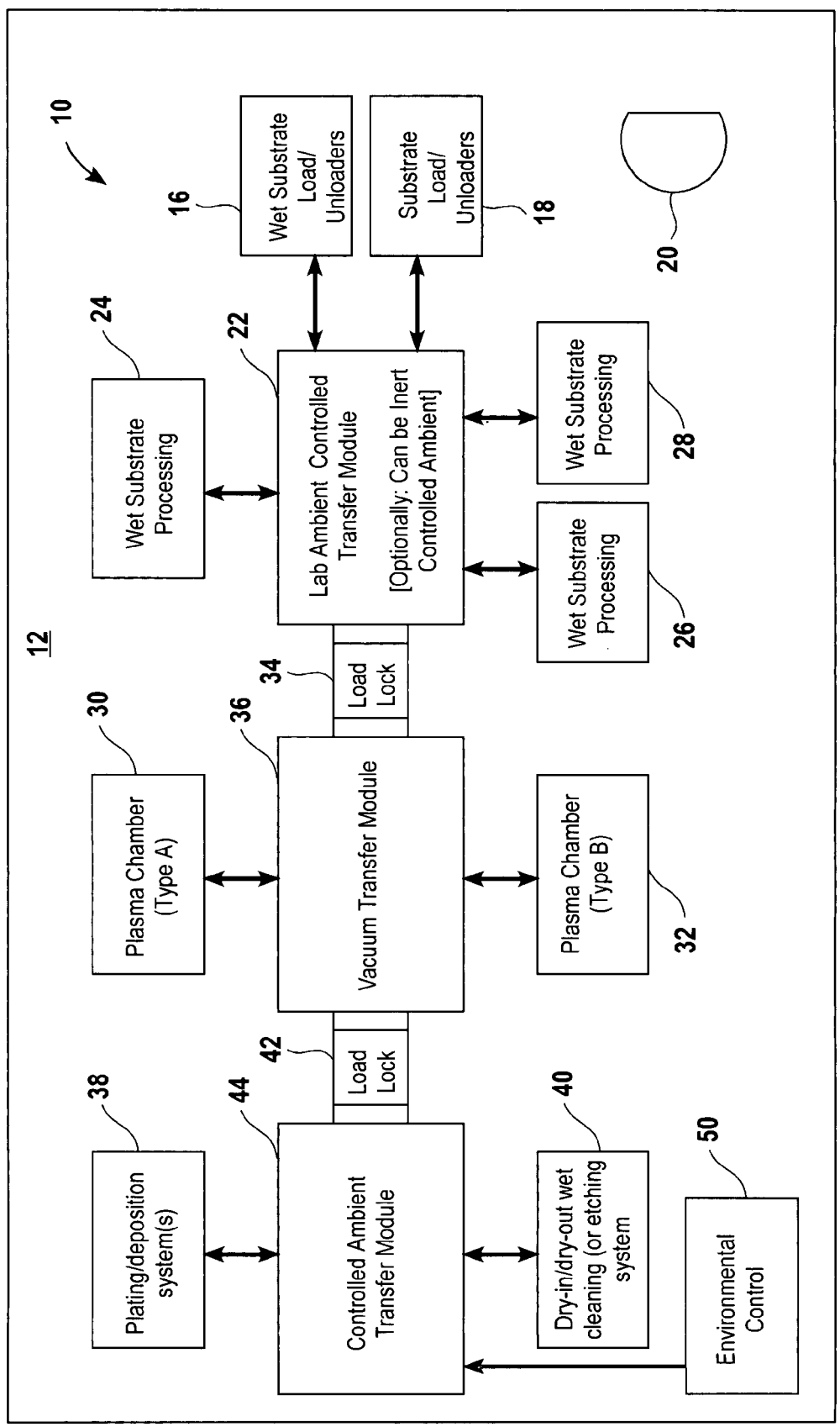
FIG. 1 is a plan view of a substrate processing system including the present inventions.

Referring to FIG. 1 an embodiment of the present invention is included in a substrate processing system that includes a plurality of processing modules arranged is what is commonly referred to as a cluster tool 10. Cluster tool 10 is typically positioned within a clean room 12 that is defined, in part, by surrounding walls 14. The modules of cluster tool 10 typically include one or more load/unload stations, two of which are shown as 16 and 18. The atmosphere inside of cluster tool 10 is controlled to minimize, if not prevent, exposure of substrate to the ambient of clean room 12 during processing. Stations 16 and 18 facilitate transportation of a substrate 20 between clean room 12 and modules of cluster tool 10. From one of stations 16 and 18, substrate 20 is introduced into a lab-ambient controlled module 22 to facilitate wet processing may be performed.

Access to wet processing modules 24, 26 and 28 by substrate 20 is gained through lab-ambient control transfer module 22. Lab-ambient control transfer module 22 functions to ensure that substrate 20 reaming dry before entry into each of wet processing modules 24, 26 and 28. To that end, each of wet processing modules 24, 26 and 28 functions to surfaces of substrate 20 dry upon completion of processing. Access to plasma processing modules 30 and 32, after cleaning of substrate 20, is achieved through load lock 34 and vacuum transfer module 36.

Vacuum transfer module 36 interfaces with plasma processing modules 30 and 32 that may be any plasma vapor deposition processing systems known that is suitable for depositing films upon semiconductor substrate, e.g., one or more of plasma processing modules may be a plasma enhanced chemical vapor deposition PECVD system. Were substrate 20 to undergo processing in plating/deposition module 38 or etch processing in etch system module 40 before/after or without undergoing plasma processing, a traversal through load lock 42. After traversing load lock 42, substrate enters Controlled Ambient Transfer Module 44 that facilitates access to modules 38 and 40 without exposing substrate to the ambient of clean room 12.

In fluid and electrical communication with modules 16, 18, 20, 22, 24, 26, 28, 30, 32, 34, 36, 38, 40, 42 and 44 is an environmental control system 50 that regulates the operations of each of modules 16, 18, 20, 22, 24, 26, 28, 30, 32, 34, 36, 38, 40, 42 and 44 so that the environment present therein is suitable for the processing desired. An example of cluster tool is discussed in U.S. patent application Ser. No. 11/639,752 that is incorporated by reference herein.

Figure 2:
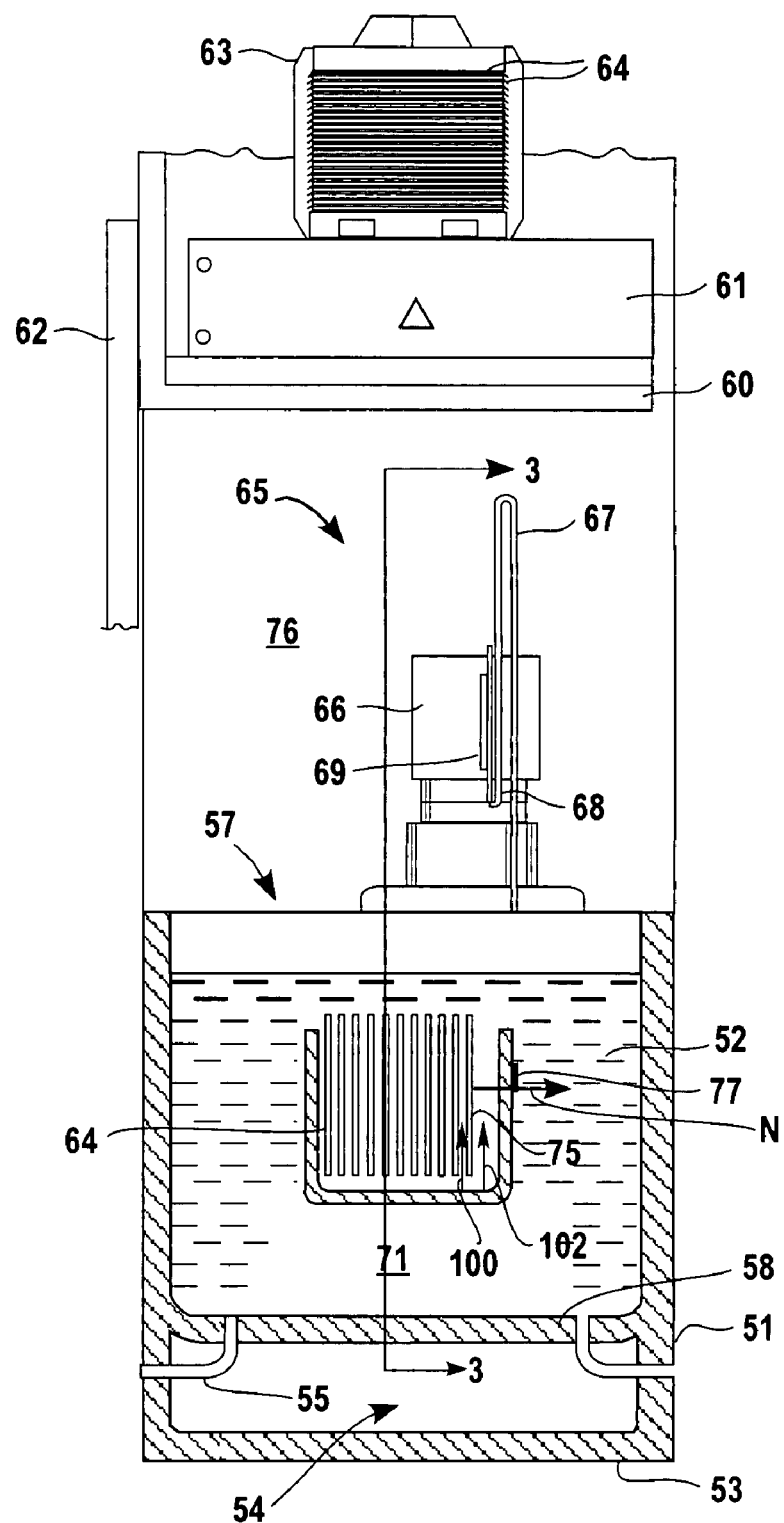
FIG. 2 is a simplified side view of an exemplary substrate cleaning system in accordance with one embodiment of the present invention.

Referring to both FIGS. 1 and 2, an embodiment of one or more of wet processing modules 24, 26 and 28 of figure includes a body 51 formed from any suitable material such as aluminum, plastic and the like. Body 51 defines an immersion tank 52 that is spaced-apart from an end 53 defining a void 54 therebetween through which conduits 55 pass to place immersion tank 52 in fluid communication with additional systems (not shown). A tank opening 57 is disposed opposite to the closed end 58 of immersion tank 52. Positioned opposite to opening 57 is a shelving system 60. One or more bases 61 may be disposed upon shelving system 60. Shelving system 60 operates to reciprocate between a first position proximate to opening 57 (as shown) and a second position located remotely with respect to opening 57. To that end, a track 62 is provided along which shelving system 60 moves. In the second position, opening 57 is unobstructed, allowing access to immersion tank 52.

Disposed upon base 61 is a substrate cassette 63 that operates to retain substrates, such as semiconductor substrate 64. To move substrates 64 between cassette 63 and tank 52 a substrate transport system (STS) 65 is positioned proximate to immersion tank 52. STS 65 includes a robot 66, with a picker arm 67 coupled thereto. Picker arm 67 has a picker 68 coupled thereto that has end effector 69. Picker arm 67 is controlled by robot 66 to move and index the picker 68 with respect to immersion tank 52 enable positioning of end effector 69 in immersion tank 52. To that end, robot 66 may include a stepper motor, a servo motor, or other type of motor to provide precise control of the picker arm 67. Picker arm 67 is configured to pivot end effector 69 to extend along two transversely orientated planes to facilitate movement of substrates 64 from cassette 63 into cassette 70, disposed in tank 52. To that end, end effector 69 is provided with suitable size and functionality to manipulate substrates 64.

In the present example STS 65 is shown with picker arm 67 positioned on the exterior of immersion tank 52. STS 65 facilitates insertion of picker 68 into immersion tank 52 to a level lower than substrates 64 disposed in cassette 70. As a result, substrates 64 may be processed in immersion tank 52 to remove particulate matter present on the surfaces of substrate 64. To that end, immersion tank 52 includes a cleaning solution 71 of sufficient quantity to allow most, if not the entire area, of all surfaces of substrates 64 to be covered by the same.

Figure 3:
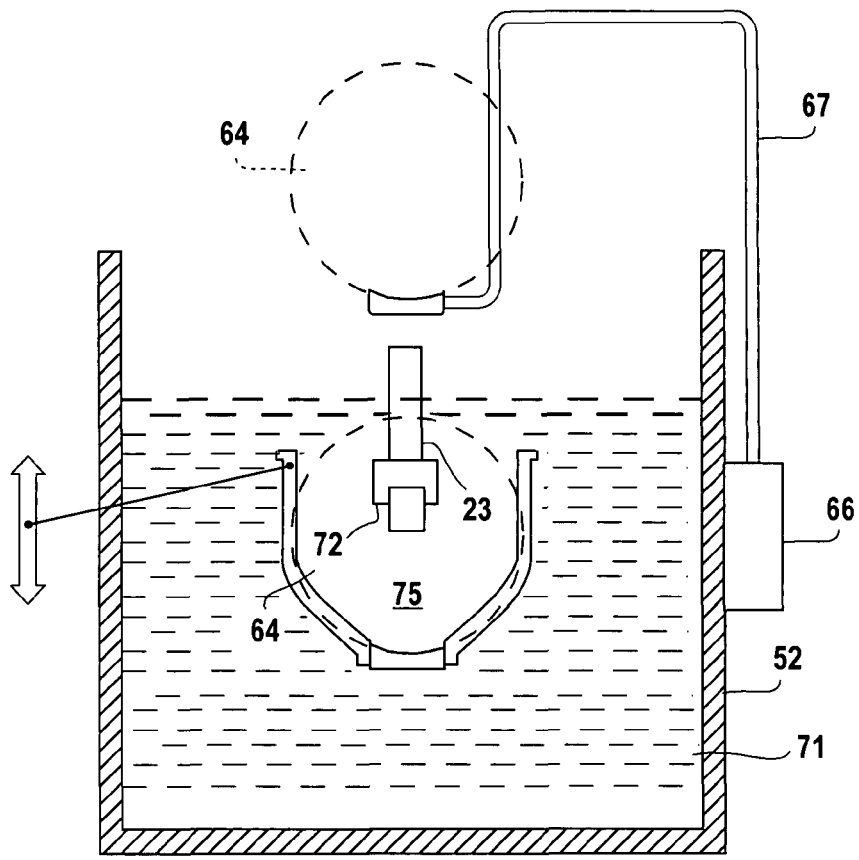
FIG. 3 is a side view of an immersion tank shown in FIG. 2 and substrate transport system taken along lines 3-3.
Figure 4:
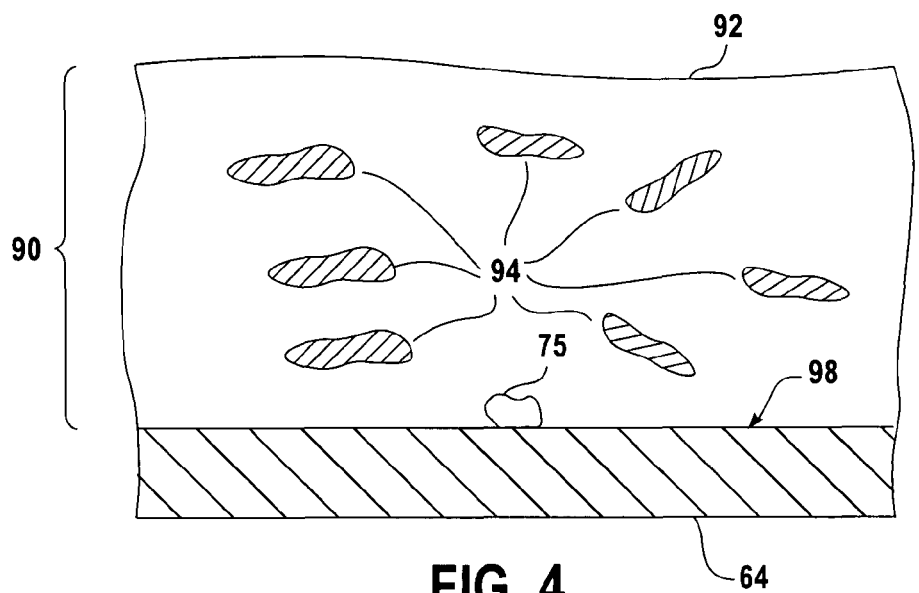
FIG. 4 is a plan view showing a liquid employed to remove particulate contaminants from a substrate surface in accordance one embodiment of the present embodiment.

Referring to FIGS. 2, 3 and 4, with shelving system 60 in the second position opening 57 is exposed, allowing unobstructed access to introduce, and retain, cassette 70 in tank 52 vis-à-vis hanger 72 that is attached to hanger arm 73. Hanger arm 73 is coupled to a motor (not shown) to vary a position of cassette 70 in immersion tank 52. In one embodiment of the present invention, STS 65 is used to move cassette 70 into immersion tank 52 when loaded with multiple substrates 64. In this fashion, batch processing of substrates 64 may be undertaken during a cleaning process. For example, substrate 64 may have contaminants 75 thereon. Immersion tank may be filled with solution. Picker arm 67 couples to detent 77 on cassette 70 to move the same into and out of immersion tank 52. The movement of cassette 70 in solution loosens, softens, dislodges, or otherwise enhances the removal of residues, chemicals and particulates, referred to as contaminants 75, from surfaces of substrates 64. The speed at which cassette 70 is introduced into immersion tank 52 is established to facilitate removal of contaminants 75 from substrates 64. Specifically, solution is fabricated to have the appropriate characteristics to interact with contaminants 75 and remove the same from the surfaces of substrate 64. Similarly, the speed at which cassette 70 is removed from solution 71 also facilitates removal of contaminants from substrate 64. As a result, it is possible to introduce cassette 70 and substrates into immersion tank 52 before solution 71 is present. After cassette 70 and substrate 64 are present in immersion tank 52, solution 71 is introduced and the movement of solution 71 with respect to each of substrates 64 facilitates removal of contaminants 75 therefrom. After removal of substrate 64 from immersion tank 52, the same may be exposed to a rinse process to remove solution 71 and/or loosens contaminants that remain. This may occur, for example, in one of the remaining wet processing modules 24, 26 and 28 by inserting the cassette 70 full of substrate 64 into a tank (not shown) into a rinse state having a solution of de-ionized water DIW or a solution of IPA to facilitate a batch rinse. It should be understood that STS 65 may be employed to remove each substrate 64, individually, from cassette 70 by picker arm 67, which lifts the same into space 76 where substrate 64 is retrieved by robot 66 for movement to a rinse station that is well known in the art.

Referring to both FIGS. 3 and 4, an exemplary material that may form solution 71 includes a suspension 90 having multiple regions, with differing flow characteristics so that the flow characteristics associated with one of the regions differs from the flow characteristics associated with the remaining regions. In the present example, suspension 90 includes a liquid region 92 and a coupling element 94. Liquid region 92 has a first viscosity associated therewith. Coupling element 94 may comprise rigid solid bodies, malleable solid bodies or solid bodies having fluidic characteristics, i.e., solid bodies having a viscosity that is much greater than the viscosity associated with liquid region 92. Coupling elements 94 are entrained throughout a volume of liquid region 92 such that liquid region 92 functions as a transport for coupling elements 94 in furtherance of placing coupling elements 94 proximate to particulate contaminants 75 present on a surface 98 of substrate 64.

Coupling elements 94 consist of a material capable of removing contaminants 75 from surface 98 through transfer of forces from suspension 90, i.e., movement of liquid regions 92, to contaminant 75 vis-à-vis coupling elements 94. Thus, it is desired to provide coupling elements 94 with a cross-sectional area sufficient to remove contaminant 75 from surface 98. Typically, the cross-sectional area of coupling elements 94 is greater than a cross-sectional area of contaminant 75. In this manner, movement of contaminant 75 in response to a drag force $\vec{F}_d$ acting upon coupling element 94 is facilitated, with the understanding that drag force $\vec{F}_d$ includes both a frictional forces $\vec{F}_{fc}$ and normal forces, with the normal forces including momentum. Drag force $\vec{F}_d$ is a function of the physical properties and relative velocities associated with liquid region 92 and coupling elements 94.

Figure 5:
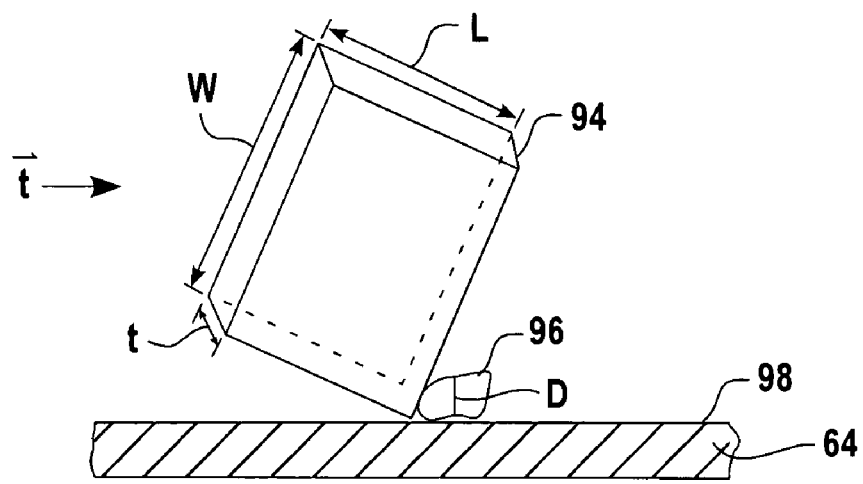
FIG. 5 is demonstrating the relative cross-sectional areas of malleable regions in the suspension in relation to contaminants in FIG. 4 in accordance with the present invention.

Friction force $\vec{F}_{fc}$, the tangential component of drag force $\vec{F}_d$, on the surface of contaminant 75 is a function of the shear stress at the contaminant surface multiplied by the surface area of the contaminant: $\vec{F}_{fc} = \vec{\tau}_c A_c$. The friction force $\vec{F}_f$ acting upon the coupling element is the shear stress at the coupling element surface multiplied by the surface area of the coupling element: $\vec{F}_f = \vec{\tau} A$. A coupling element 94 in contact with contamination 96 directly transfers its friction force. Thus, the contaminant experiences an apparent shear stress that is a ratio of the coupling element 94 to contaminant 75 surface areas. Specifically, the apparent shear force $\vec{\tau}_c$ to which contaminant experiences is $$\vec{\tau}_c = \vec{\tau} A/A_c$$

where A is the cross-section area of coupling element 94 and $A_c$ is the cross-sectional area of contaminant 75. Assume, for example, that an effective diameter, D, of contaminant 75 is less than about 0.1 micron and a width, W, and length, L, of coupling element 94 are each between about 5 microns to about 50 microns. Assuming a thickness, t, of coupling element 94 is between about 1 to about 5 microns, the ratio (or stress multiplier) could range between 2,500 to about 250,000. This number will increase when the normal forces are included in the drag force $\vec{F}_d$ calculation. Coupling element 94, shown in FIG. 5, is discussed with respect to being a hexahedron for ease of discussion. However, it should be understood that coupling elements are of substantially arbitrary shapes and that the length, L, width, W, and thickness, t, referred to above is the average value for coupling elements 94 in suspension.

Figure 6:
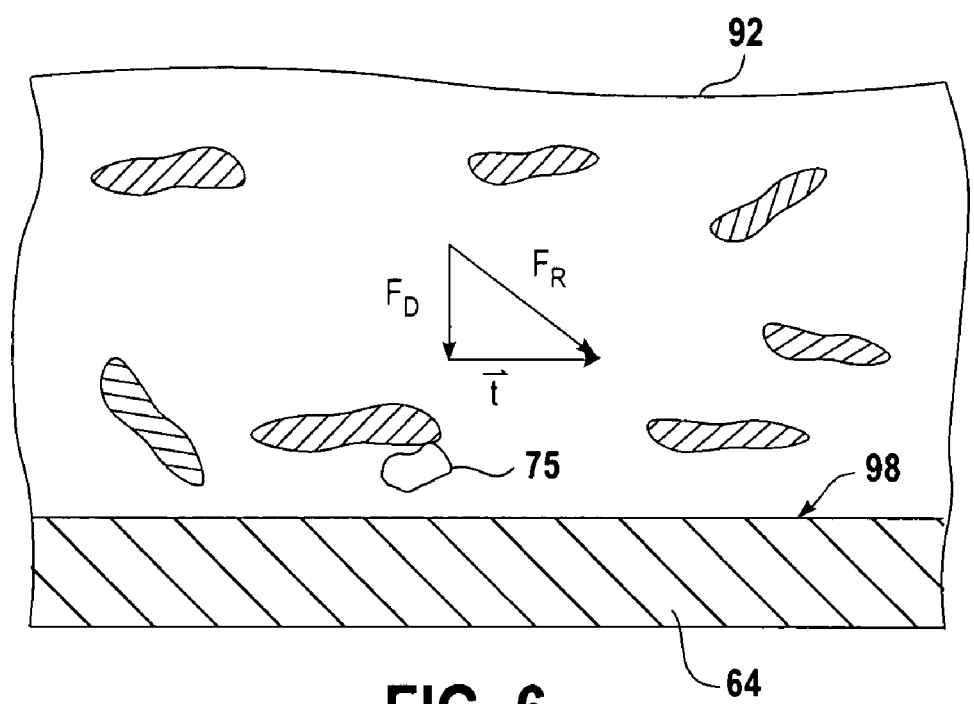
FIG. 6 is plan view of a liquid employed shown in FIG. 4 demonstrating the forces exerted on a particulate in furtherance of removing the particulate contaminant from the wafer surface in accordance with the present invention.

Referring to FIG. 6, forces transferred to contaminant 75 vis-à-vis coupling elements 94 occur through coupling of coupling elements 94 to contaminant through one or more various mechanisms. To that end, liquid region 92 exerts a downward force $\vec{F}_D$ on coupling elements 94 within liquid region 92 such that coupling elements 94 are brought within close proximity or contact with contaminants 75 on surface 98. When coupling element 94 is moved within proximity to or contact with contaminant 75, coupling may occur between coupling element 94 and contaminant 75. The coupling mechanism that results is a function of the materials, and properties thereof, from which coupling elements 94 and contaminant 75 are formed. Interaction between coupling element 94 and contaminant 75 is sufficient to allow the transfer of a force of sufficient magnitude to overcome an adhesive force between contaminant 75 and surface 98, as well as any repulsive forces between coupling element 94 and contaminant 75. Thus, upon coupling element 94 moving away from surface 98 by a shear force $\vec{\tau}$ contaminant 75 that is coupled thereto is also moved away from surface 98, i.e., contaminant 75 is cleaned from surface 98.

One such coupling mechanism is mechanical contact between coupling elements 94 and contaminant 75. To that end, coupling elements 94 may be more or less malleable than contaminant 75. In an embodiment wherein coupling elements 94 are more malleable than contaminants 75, the force imparted upon contaminant 75 is reduced due to deformation of coupling elements 94 occurring from impact with contaminant 75. As a result, contaminant 75 may become imprinted within coupling element 94 and/or entangled in a network of coupling elements 94. This may produce a mechanical linkage between coupling element 94 and contaminant 75, fixing the relative position therebetween. Mechanical stresses may be transferred of coupling elements 94 to contaminant 75, thereby increasing the probability that contaminant 75 is broken free from surface 98. Additionally, a chemical coupling mechanism, such as adhesion between contaminant 75 and coupling elements 94, may occur.

Where coupling elements 94 and contaminant 75 sufficiently rigid, a substantially elastic collision would occur resulting in a significant transfer of energy from coupling elements 94 to contaminant 75, thereby increasing the probability that contaminant 75 is broken free from surface 98. However, the chemical coupling mechanism of adhesion between coupling elements 94 and contaminant 75 may be attenuated, which may reduce the probability gained by the collision.

In addition, to mechanical and chemical coupling mechanisms discussed above, electrostatic coupling may occur. For example, were coupling element 94 and contaminant 75 to have opposite surface charges they will be electrically attracted. It is possible that the electrostatic attraction between coupling element 94 and contaminant 75 can be sufficient to overcome force connecting contaminant 75 to surface 98. It should be realized that one or more the aforementioned coupling mechanisms may be occurring at any given time with respect to one or more contaminants 75 on surface. In addition, this may occur randomly or be induced by having coupling element 94 formed from different materials and having different shape and hardness. Alternatively, the electrostatic repulsive interaction between the approaching coupling element 94 and the contaminant 75 may be strong enough to dislodge the contaminant 75 from the surface 98.

Figure 7:
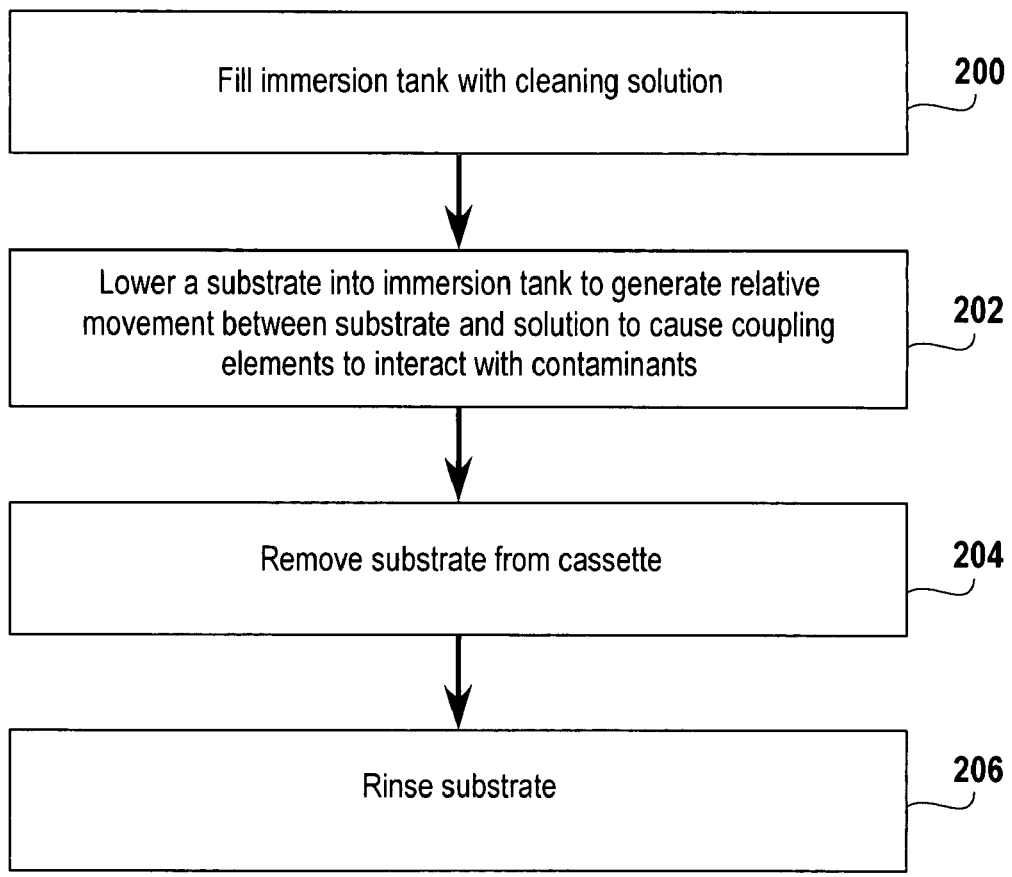
FIG. 7 is a flow diagram demonstrating a process for cleaning a substrate shown in FIGS. 2 and 3.

Referring to FIGS. 2, 4 and 7, interaction of coupling elements 94 with contaminant 75 is achieved, in part, by generating relative movement between substrates 64 and solution 71. Relative movement between suspension 90 and substrate 64 occurs at a rate to impart sufficient momentum to allow coupling elements 94 to impact with contaminants 75 and impart a sufficient drag force $\vec{F}_D$ to move contaminant from surface 98 of substrate 64, as discussed above. In one embodiment of the present invention, relative movement occurs by placing cassette 70 into solution 71 at a requisite velocity to generate the momentum discussed above and without causing so a quantity of momentum that would damage features of substrate 64 should the same impact with coupling elements 94. This occurs, in part, by filling immersion tank 52 with solution 71 at function 200. At function 202 cassette 70, having a least one substrate 64 with contaminants 75 thereon, is lowered into solution 71, generating relative movement between solution 71 and substrate 64. In this manner, two spaced apart flows 100 and 102 are created around substrate 64. As shown flow 100 is adjacent to a side of substrate 64 that is opposite to the side to which flow 102 is adjacent. The direction of flows 100 and 102 is substantially transverse to a normal, N, to a surface of substrate 64. Flow 100 and 102 each has coupling elements 94 entrained therein. The relative movement imparts sufficient drag upon a subset of coupling elements 94 in each of flows 100 and 102 to interact with and cause contaminants 75 to move with respect to the substrate 64 and be removed therefrom. Following a sufficient amount of movement substrates may be removed from cassette 70 by the manner discussed above; at function 204. Following removal substrate 64 may be rinsed to as to completely remove contaminants remaining on substrate 64 by, for example, a de-ionized water (DIW) rinse at function 206. Alternatively, solution 71 may be drained vis-à-vis one of conduits 55. Thereafter, another one of conduits 55 may be employed for the introduction of DIW to rinse any remaining contaminants from substrates 64.

Figure 8:
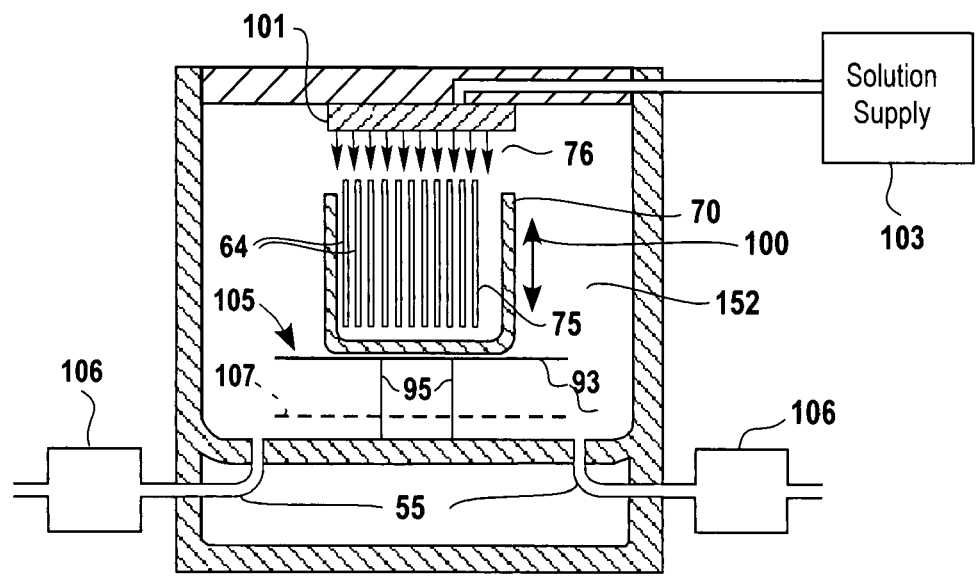
FIG. 8 is a cross-section view of the immersion tank shown in FIG. 4 in accordance with an alternate embodiment.

Referring to both FIGS. 4 and 8, in another embodiment, cassette 70 is lowered into immersion tank 52 in the absence of solution 71. Specifically, cassette 70 is placed to rest upon shelf 93 that is supported upon closed 58 by supports 95. Thereafter, solution 71 is introduced into immersion tank 52 by a showerhead 101. To that end, showerhead 101, in fluid communication with a supply 103 of solution 71, is designed to produce a plurality of flows of solution 71 having coupling elements 94 entrained therein. Concurrently with ingress of solution 71 into immersion tank 52, conduits 55 may function as drains to remove the same therefrom. Showerhead 101 is configured to generate a curtain of solution 71, which is flowed over opposed surface of each of substrates 64 for a sufficient amount of time to remove contaminants 75 from the surfaces thereof. In another embodiment of the present invention, conduits 55 may be closed to allow solution 71 exiting showerhead 101 to accumulate in immersion tank 52 and allow substrate 64 to become submerged in solution 71. This may be undertaken by coupling of a pump system 106 to each of conduits 55 to control the flow rate therethrough. Posts 95 may be configured to allow shelf to reciprocating between position 105 and position 107. In this manner, relative motion between solution 71 and opposed surfaces of each of substrates 64 may occur along opposing directions.

Exemplary embodiments of suspension 90 includes a liquid region 92 having a viscosity between about 1 Centipoises (cP) to about 10,000 cP. Moreover, liquid regions 69 may be a Newtonian fluid or a non-Newtonian fluid. Exemplary materials that may be employed as liquid region 92 include de-ionized water (DIW), hydrocarbon, a fluorocarbon, a mineral oil, or an alcohol and the like. Furthermore, suspension 90 may include ionic or non-ionic solvents and other chemical additives. For example, the chemical additives to suspension 90 can include any combination of co-solvents, pH modifiers, chelating agents, polar solvents, surfactants, ammonia hydroxide, hydrogen peroxide, hydrofluoric acid, tetramethylammonium hydroxide, and rheology modifiers such as polymers, particulates, and polypeptides.

Coupling elements 94 may possess physical properties representing essentially any sub-state such that in addition to the properties set forth above, do not adhere to surface 98 when positioned in close proximity or contact with surface 98. Additionally, the damage caused to surface 98 by coupling elements 94 should be deminimus, as well as the adhesion between coupling elements 94 and surface 98. In one embodiment, the hardness of coupling elements 94 is less than the hardness of surface 98. Moreover, it is desired that coupling element 94 avoiding adherence to surface 98 when positioned in either close proximity to or in contact with surface 98. Various embodiments coupling elements 94 may be defined as crystalline solids or non-crystalline solids. Examples or non-crystalline solids include aliphatic acids, carboxylic acids, paraffin, wax, polymers, polystyrene, polypeptides, and other visco-elastic materials. To that end, the quantity of coupling elements 94 in suspension 90 should be present at a concentration that exceeds its solubility limit within liquid region 92.

It should be understood that the aliphatic acids represent essentially any acid defined by organic compounds in which carbon atoms form open chains. A fatty acid is an example of an aliphatic acid that can be used as coupling element 94 within suspension 90. Examples of fatty acids that may be used include lauric, palmitic, stearic, oleic, linoleic, linolenic, arachidonic, gadoleic, eurcic, butyric, caproic, caprylic, myristic, margaric, behenic, lignoseric, myristoleic, palmitoleic, nervanic, parinaric, timnodonic, brassic, clupanodonic acid, lignoceric acid, cerotic acid, and mixtures thereof, among others.

In one embodiment, coupling elements 94 may represent a mixture of fatty acids formed from various carbon chain lengths extending from C-1 to about C-26. Carboxylic acids are defined by essentially any organic acid that includes one or more carboxyl groups (COOH). When used as coupling elements 94, the carboxylic acids can include mixtures of various carbon chain lengths extending from C-1 through about C-100. Also, the carboxylic acids can include other functional groups such as but not limited to methyl, vinyl, alkyne, amide, primary amine, secondary amine, tertiary amine, azo, nitrile, nitro, nitroso, pyridyl, carboxyl, peroxy, aldehyde, ketone, primary imine, secondary imine, ether, ester, halogen, isocyanate, isothiocyanate, phenyl, benzyl, phosphodiester, sulfhydryl, but still maintaining insolubility in suspension 90.

One manner by which to form suspension 90 with regions formed from carboxylic acid components includes presenting liquid regions 69 as a gel that is formed from a concentration of carboxylic acid solids, such as between about 3% to about 50 wt % and preferably between about 4% to about 20 wt %, with De-ionized water (DIW). Ammonium hydroxide may be added to the solution and the mixture heated to between 55° C. to about 85° C., inclusive to facilitate the solids going into solution, i.e., dissolving. Once the solids are dissolved, the cleaning solution can be cooled down. During the cooling down process, solid compounds in the form of needles or plates would precipitates. An exemplary suspension 90 formed in this manner has a viscosity of about 1000 cP at 0.1 per second shear rate and the viscosity falls to about 10 cP when the shear rate increases to 1000 per second, i.e., it is a non-Newtonian fluid. It should be understood that suspension may be formed by carboxylic acid(s) (or salts) in solvents other than water, polar or non-polar solvents, such as alcohol, may be employed.

Another embodiment of suspension 90 has coupling elements 94 are formed from a hydrolyzed chemical agent, or by including a surfactant. For example, a dispersant material may be included in liquid region 92 to facilitate dispersal of coupling element 94 throughout suspension 90. To that end, a base can be added to suspension 90 to enable entrainment of coupling elements 94 from materials such as carboxylic acid or stearic acid that are present in less than stoichiometric quantities. An exemplary base is Ammonium Hydroxide, however, any commercially available base may be used with the embodiments described herein. Additionally, the surface functionality of the materials from which coupling elements 94 are formed may be influenced by the inclusion of moieties that are miscible within suspension 90, such as carboxylate, phosphate, sulfate groups, polyol groups, ethylene oxide, etc. In this manner, it may be possible to disperse coupling elements 94 throughout suspension 90 while avoiding unwanted agglomeration of the same, i.e., form a substantially homogenous suspension 90. In this manner, avoided may be a situation in which an agglomeration of coupling elements 94 becomes insufficient to couple to and/or remove contaminant 96 from surface 98.

Figure 9:
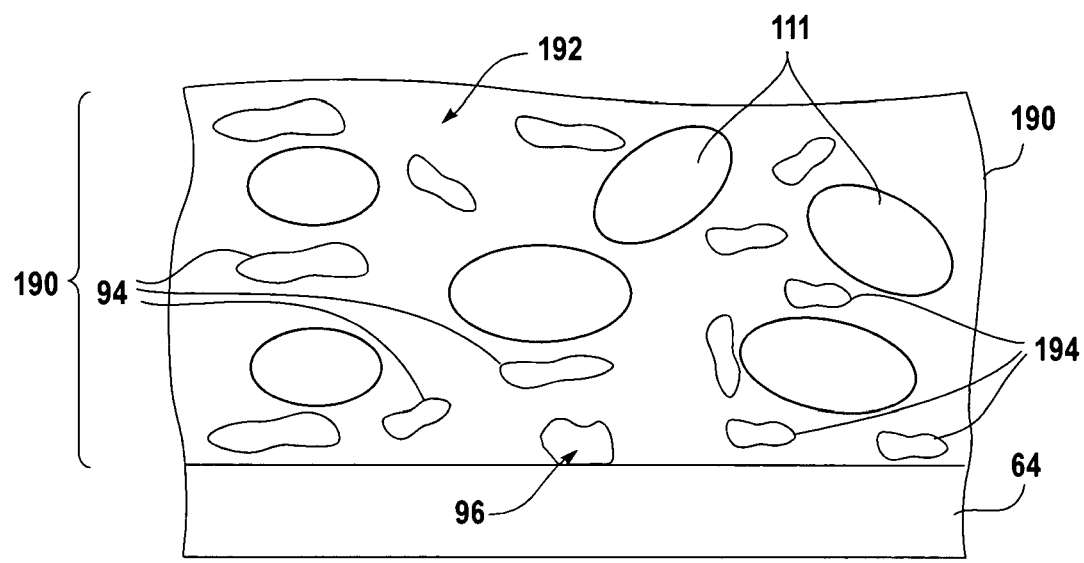
FIG. 9 is a plan view showing a liquid employed to remove particulate contaminants from a substrate surface in accordance with another embodiment of the present invention.

Referring to FIG. 9, in another alternate embodiment, suspension 190 may include an additional component, referred to as an immiscible component 111 that is entrained in liquid region 192. Immiscible components include may include a gas phase, a liquid phase, a solid phase of material, or a combination thereof. In the present example, immiscible components 111 are regions comprising entirely of a plurality of spaced-apart gas pockets dispersed throughout liquid region 192 of suspension 190. The immiscible components comprise from 2% to 99%, inclusive suspension 190 by volume. Exemplary gas phase immiscible components 111 may be formed from the following gases: nitrogen, $N_2$, argon, Ar, oxygen, $O_2$, ozone, $O_3$, peroxide, $H_2O_2$, air, hydrogen, $H_2$, ammonium, $NH_3$, hydrofluoric acid, HF.

Liquid phase immiscible components 111 may include a low-molecular weight alkane, such as, pentane, hexane, heptane, octane, nonane, decane, or mineral oil. Alternatively, liquid phase immiscible components 111 may include oil soluble surface modifiers. Referring to both FIGS. 4 and 9, suspension 190 functions substantially similar to suspension 90 with respect to removing contaminant 75, with coupling elements 94 being substantially similar to coupling elements 94 and liquid region 192 being substantially similar to liquid region 92. In suspension 190, however, immiscible component 111 is believed to facilitate placing coupling elements 194 in contact with, or close proximity to, contaminant 75. To that end, one or more of regions in close proximity to, or contact with contaminant 75, is disposed between contaminant 75 and one or more immiscible components 111. Having a surface tension associated therewith, immiscible component 111 subjects coupling elements 194 to a force (F) on coupling element 194 in response to forces in liquid region 192. The force (F) moves coupling element 194 toward surface 98 and, therefore, contaminant 75. Coupling between coupling element 194 and contaminant 75 may occur in any manner discussed above with respect to coupling elements 94 and contaminant 75.

Immiscible components 111 may be entrained in suspension 190 before being disposed on substrate 64. Alternatively, immiscible components 111 may be entrained in suspension 190 in-situ as suspension is being deposited on surface 98 and/or may be generated by impact of suspension 190 with surface 98 thereby entraining gases, such as air, present in the surrounding ambient, e.g., generating a foam. In one example, immiscible components 111 may be generated from a gas dissolved within liquid region 192 that comes out of solution upon suspension 190 being subjected to a decrease in ambient pressure relative to pressure of suspension 190. On advantage of this process is that the majority of immiscible components 111 will form proximate to coupling elements 194, due to coupling elements 194 have moved settled under force gravity toward surface 98. This increases the probability that coupling elements 194 coupling with contaminant 75.

As with bi-state suspension 90, tri-state suspension 190 may include additional components to modify and improve the coupling mechanism between coupling elements 194 and contaminant. For example, the pH of the liquid medium can be modified to cancel surface charges on one or both of the solid component and contaminant such that electrostatic repulsion is reduced or amplified. Additionally, the temperature cycling of suspension 190 may be employed to control, or change, the properties thereof. For example, coupling elements 94 may be formed from a material, the malleability of which may change proportionally or inversely proportionally with temperature. In this fashion, once coupling elements 94 conform to a shape of contaminant, the temperature of suspension may be changed to reduce the malleability thereof. Additionally, the solubility of suspension 190 and, therefore, the concentration of coupling elements 94 may vary proportionally or inversely proportionally with temperature.

An exemplary suspension 190 is fabricated by combining Stearic acid solids, heated above 70° Celsius, to DIW heated above 70° Celsius. The quantity of Stearic acid solids combined with the DIW is approximately 0.1% to 10%, inclusive by weight. This combination is sufficiently to disperse/emulsify the Stearic acid components within the DIW. The pH level of the combination is adjusted above 9 to neutralize the stearic acid components. This is achieved by adding a base, such as ammonium hydroxide ($NH_4OH$) to provide a concentration of 0.25% and 10%, inclusive by weight. In this manner, an acid-base mixture is formed, which is stirred for 20 minutes to ensure the homogeneity of the mixture. The acid-base mixture is allowed to reach ambient temperature allowing the fatty acid salt to precipitate and form coupling elements 194. It is desired that coupling elements 194 formed during precipitation reach a size in a range of 0.5 to 5000 micrometers, inclusive. Immiscible component 111 may be formed from entrainment of air within the acid-base mixture as the same is stirred, if desired.

In another embodiment, suspension 190 is formed by from granular Stearic acid solids milled to a particle size in a range of 0.5 to 5000 micrometers, inclusive. The milled Stearic acid in granular form is added to DIW while agitating the same to form an acid-DIW mixture. Agitation of the DIW may occur by any means known, such as shaking, stirring, rotating and the like. The Stearic acid forms approximately 0.1% to 10%, inclusive, by weight of the acid-DIW mixture. Dissociation of the Stearic acid is achieved by establishing the pH level of the acid-DIW mixture to be approximately 9 by adding a base. An exemplary base includes ammonium hydroxide ($NH_4OH$) in a concentration of 0.5% to 10%, inclusive by weight. The base neutralizes the Stearic acid component forming ammonium stearate salt particles. Typically the $NH_4OH$ is added to the acid-DIW mixture while the same is being agitated to disperse the solidified Stearic acid particles throughout the acid-DIW mixture. The size distribution of these solidified ammonium stearate particles is in a range of 0.5 to 5,000 micrometers, inclusive.

In yet another embodiment, suspension 190 is formed from a Stearic-palmitic acid mixture dissolved in isopropyl alcohol (IPA) while the IPA is agitated, as discussed above. This provides a concentration of dissolved fatty acids present in the concentration from a range 2% to 20%, inclusive by weight. Heating of the IPA while avoiding boiling of the same and/or adding an organic solvent, such as acetone, benzene or a combination thereof, may improve solubility of the fatty acid. Any solids remaining in the concentration following dissolution may be removed by filtration or centrifugation techniques, producing a solid-free solution. The solid-free solution may be mixed with a liquid that is a non-solvent, to the fatty acid, such as water, to precipitate a fatty-acid solid. The precipitated fatty acid becomes suspended in solution with the size distribution in the range between 0.5 and 5,000 microns, inclusive. The Stearic acid component may be ionized, as discussed above.

Figure 10:
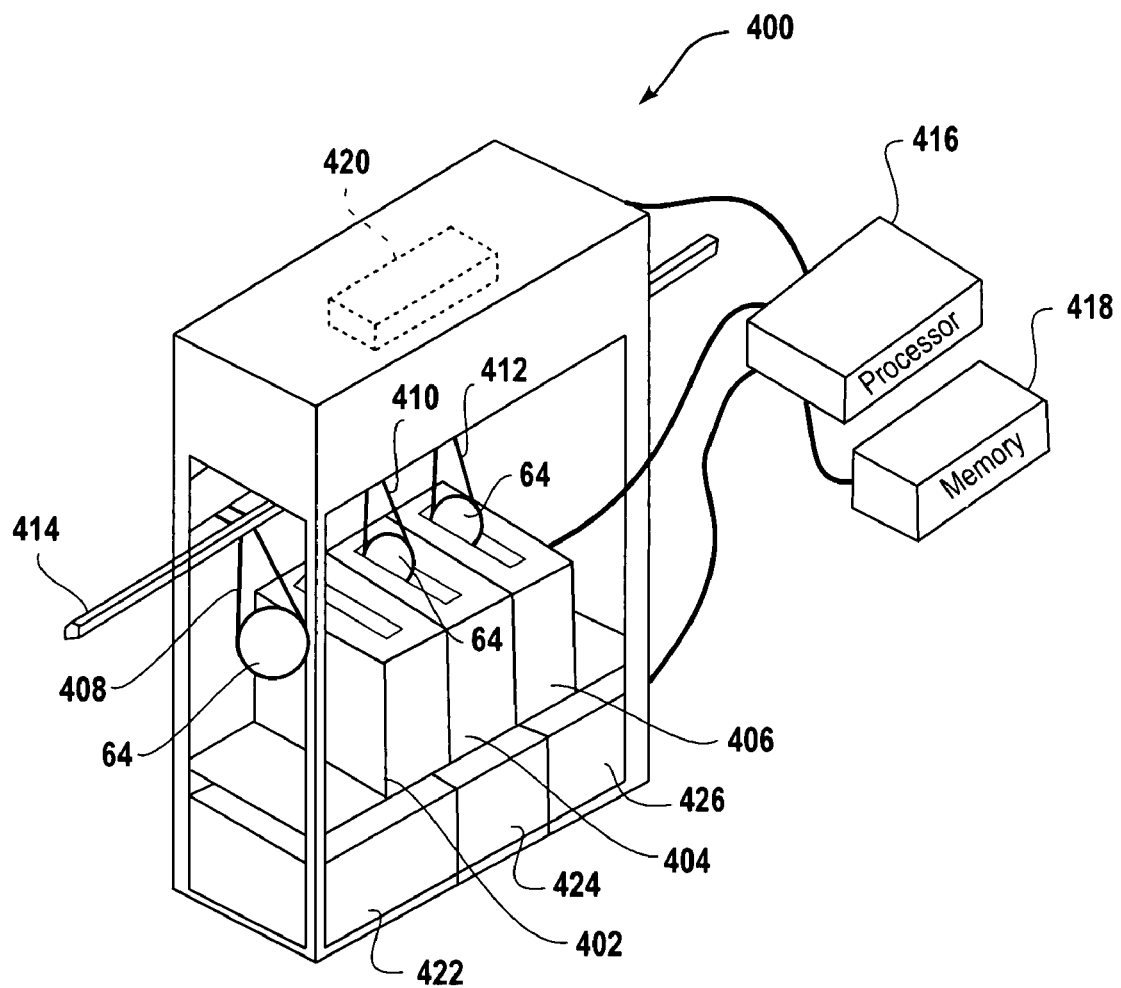
FIG. 10 is a perspective view of a system employed to clean substrates in accordance with an alternate embodiment.

Referring to FIG. 10 in accordance with another embodiment of the present invention a substrate cleaning system 400 (SCS) includes a plurality of immersion tanks, shown as 402, 404 and 406. Each of immersion tanks 402, 404 and 406 may include any one of suspensions mention above, e.g., suspension 90 or 190. A picker system that includes multiple pickers, shown as 408, 410 and 412. Each of pickers 408, 410 and 412 is coupled to reciprocate along a track 414 so that a substrate 64 held by any one of pickers 408, 410 and 412 may be placed in any one of immersion tanks 402, 404 and 406. System 400 is operated under control of a processor 416, which is in data communication with a computer-readable memory 418. Processor 416 controls operation of system 400 to submerge substrates 64 into immersion tanks 402, 404 and 406. To that end, processor is in data communication with a motor 420 that functions to move pickers 408, 410 and 412 along track 414, as well as move substrate 64 into, and out of, immersion tanks 408, 410 and 412. Processor is also in data communication with fluid supplies 422, 424 and 426 to regulate the introduction of fluids into immersion tanks 408, 410 and 412. Additionally, processor 416 is in data communication with immersion tanks 408, 410 and 412 to control the operation thereof, e.g., to allow drainage of fluids from immersion tanks 408, 410 and 412.

Figure 11:
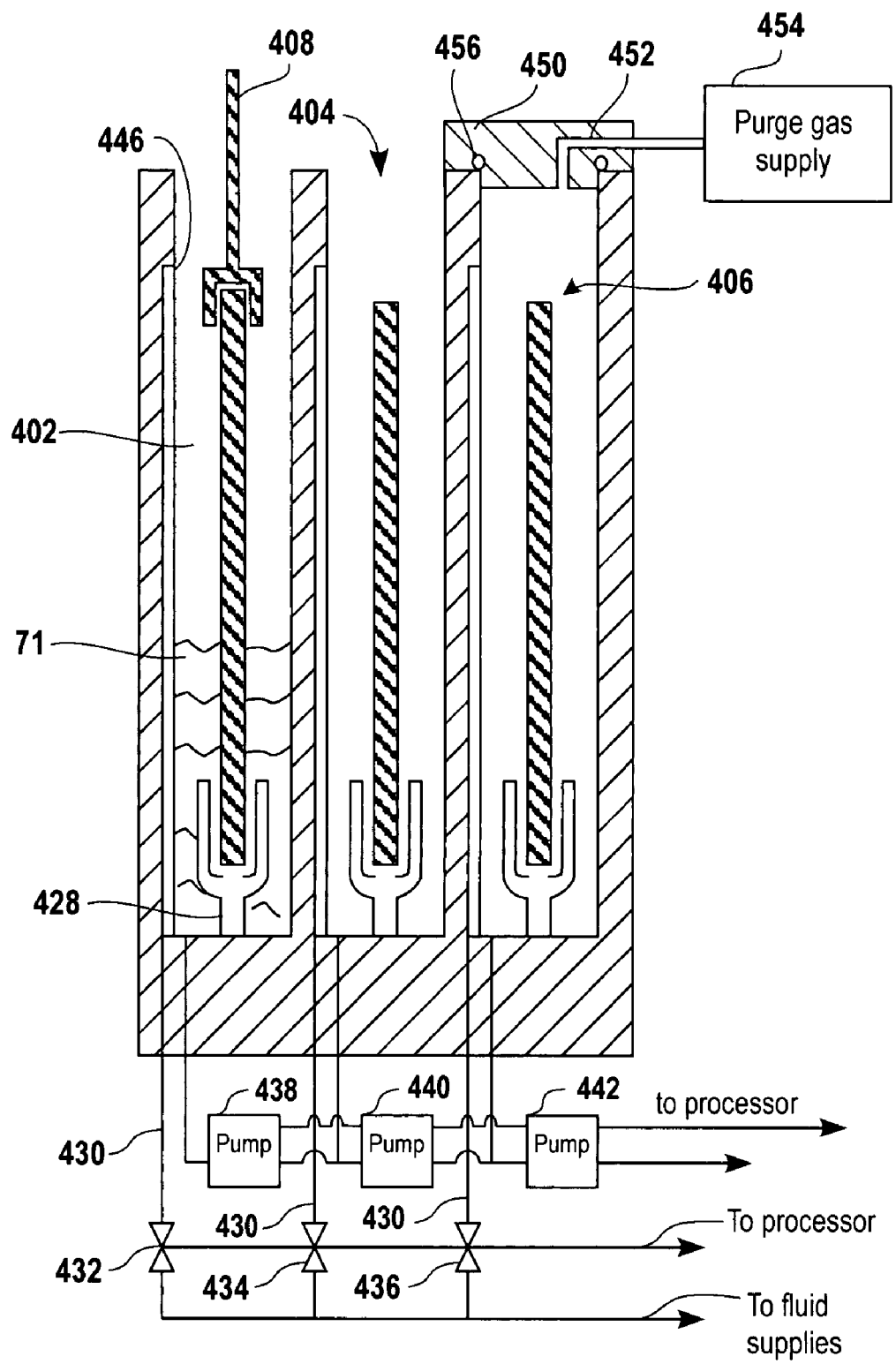
FIG. 11 is a cross-sectional view of immersion tanks shown in FIG. 10.

Referring to both FIGS. 10 and 11 in operation, one of pickers 408, 410 and 412, shown as picker 408, deposits a substrate 64 into one of immersion tanks 402, 404 and 406, shown as being immersion tank 402. While in immersion tank 402, substrate 64 rests upon support 428. Immersion tank 402 is then filled with solution 71. Solution 71 is introduced into immersion tank 402 under operation of processor 416, which facilitates pump (not shown) of fluid supply 422 to move solution 71 from there along conduits 430 and into the appropriate immersion tank 402, 404 and 406. To control flow into immersion tanks 402, 404 and 406, each of the same includes a valve 432, 434 and 436, in data communication with, and operated under control of, processor 416. Valve 432 selectively allows and prevents fluid from progressing from fluid supplies 422, 424 and 426 to immersion tank 402; valve 434 selectively allows and prevents fluid from progressing from fluid supplies 422, 424 and 426 to immersion tank 404; and valve 436 selectively allows and prevents fluid from progressing from fluid supplies 422, 424 and 426 to immersion tank 406. Drainage from immersion tanks 402, 404 and 406 is regulated by processor 416 controlling pumps 438, 440 and 442, which is in data communication therewith. Specifically, drainage of immersion tank 402 is facilitated or prevented by pump 438; drainage of immersion tank 404 is facilitated or prevented by pump 440; and drainage of immersion tank 406 is facilitated or prevented by pump 442.

During one mode of operation, solution 71 is introduced into immersion tank 402 at outlet 446 to fill upon immersion tank 402. This may be achieved before or after introducing substrate 62 into immersion tank 402. Typically, however, substrate 64 is position in immersion tank 402 before introduction of solution 71. After resting again support 428, processor 416 introduces solution 71 into immersion tank 402. As solution 71 is introduced through outlet 446, processor 416 activates pump 438 to evacuate solution 71 from immersion tank 402. In this manner, substrate 64 is exposed to a continuous flow of solution 71. It should be noted that each of immersion tanks 402, 404 and 406 may employed concurrently to expose substrate 64 to a continuous flow of solution 71. To that end, valves 432, 434 and 436 would be operated to allow the ingress of solution 71, from one of supplies 422, 424 and 426 into immersion tanks 420, 404 and 406. Alternatively, one or more of immersion tanks 402, 404 and 406 may include DIW, supplied from one of supplies 422, 424 and 426. After being exposed to solution 71, substrate 564 would be rinsed by being exposed to DIW. This may be accomplished by filling one of immersion tanks 420, 404 and 406 with DIW and then introducing substrate 64 therein. Alternatively, substrate 64 may be present in one of immersion tanks, 420, 404 and 406, after which time DIW would be introduced into the same. As well, one of immersion tanks 402, 404 and 406 may include suspension 90 while one of the remaining immersion tanks 402, 404 and 406 may include suspension 190, with the remaining immersion tanks 402, 404 and 406 would contain DIW. In this configuration, substrate 64 would be exposed to both suspensions 90 and 190 before being rinsed with DIW. It is feasible to sequentially expose substrate 64 suspensions 90 and 190 and DIW sequentially in a common immersion tank 402. If desired, immersion tanks 402, 404 and 406 may be sealed after substrate 64 is placed therein, shown by cover 450 sealing immersion tank 406 including a throughway 52 that may be connected to a purge gas supply 454, such as helium. In this manner immersion tank 406 may be environmentally controlled to reduce, if not avoid, premature drying of substrate 84. An O-ring is employed to form a hermetically-tight seal between cover 450 and immersion tank 406.

Figure 12:
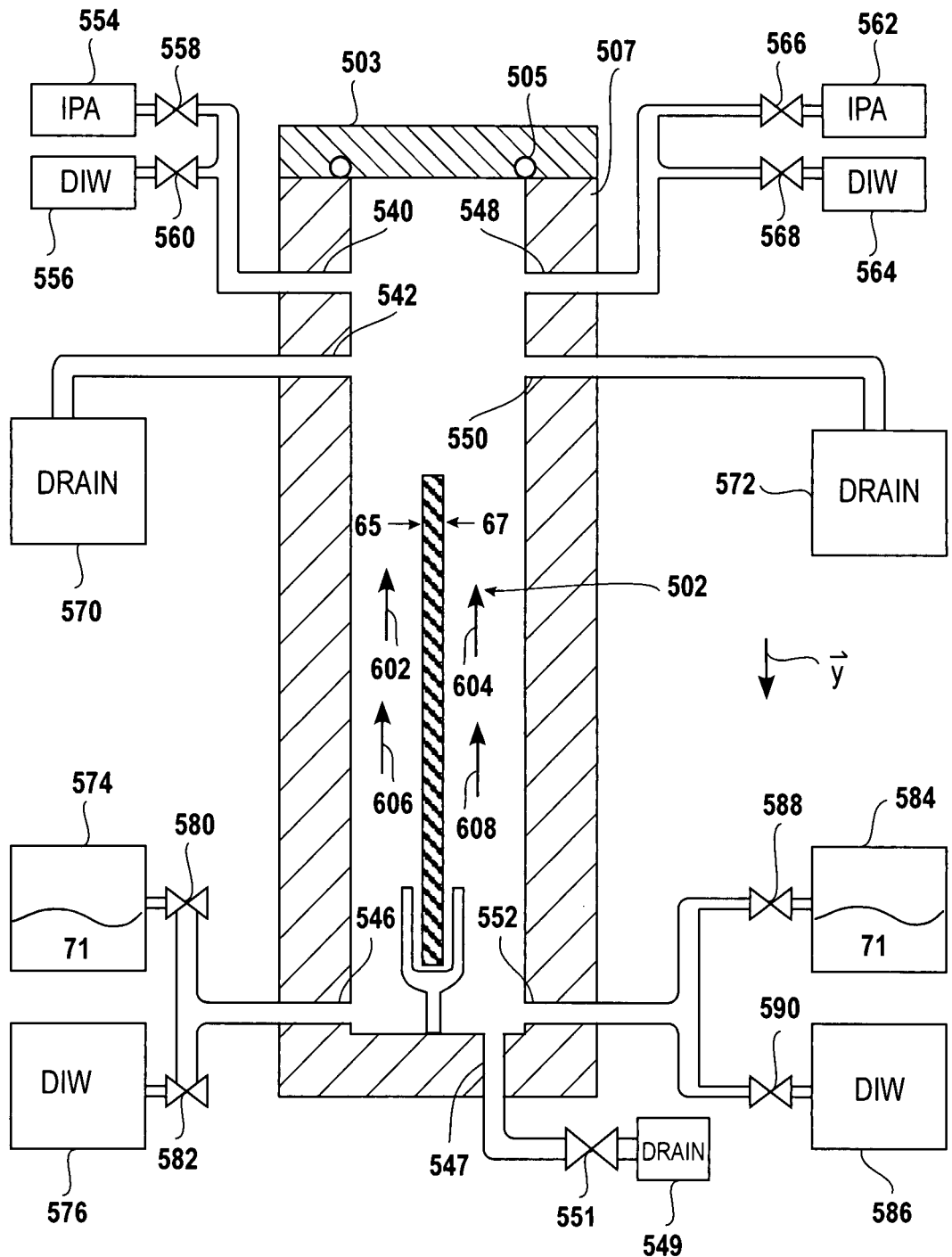
FIG. 12 is an alternate embodiment of one of the immersion tanks shown in FIGS. 10 and 11.

Referring to both FIGS. 10 and 12, another embodiment of immersion tanks 402, 404 and 406 is shown as immersion tank 502 having a lid 503 with an o-ring 505 forming a fluid tight seal with body 507 of immersion tank 502. Specifically, immersion tank includes a plurality of throughways 540, 542, 544, 546, 547, 548, 550 and 552. Throughways 540 and 548 are selectively placed in fluid communication with a supply of isopropyl alcohol (IPA) and DIW, and throughways 546 and 552 are selectively placed in fluid communication with a supply of cleaning solution and DIW. Specifically, throughway 540 may be selectively placed in fluid communication with IPA supply 554 and DIW supply 556 vis-à-vis valves 558 and 560, respectively. Throughway 548 may be selectively placed in fluid communication with IPA supply 562 and DIW supply 564 vis-à-vis valves 566 and 568, respectively. Throughways 542 and 550 are in fluid communication with drains 570 and 572, respectively. Throughway 546 may be selectively placed in fluid communication with a supply 574 of cleaning solution 71 and DIW supply 576 vis-à-vis valves 580 and 582, respectively. Throughway 547 may be selectively placed in fluid communication with drain 549 vis-à-vis a valve 551. Throughway 552 may be selectively placed in fluid communication with a supply 584 of cleaning solution 71 and DIW supply 586 vis-à-vis valves 588 and 590, respectively.

In operation, substrate 64 is placed in immersion tank 502 in the absence of solution 71. One or both of valves 580 and 588 are activated, under control of processor 416 to generate a flow of solution into immersion tank 502 through throughways 546 and 552, respectively. As a result, flows 600 and 602 of solution 71 are generated that move in a direction opposite to gravity $\vec{g}$ so as to pass adjacent to opposed surfaces 65 and 67 of substrate 64, with solution exiting immersion tank 502 by passing into throughways 542 and 550 onto drains 570 and 572, respectively. After exposure to a sufficient quantity of solution 71 surfaces 65 and 67 are rinsed by exposure to one or more of IPA and/or DIW. To that end, valves 580 and 588 are deactivated and valves 582 and 590 are activated. In this fashion, substrate 64 is exposed to DIW from supplies 576 and 586, with the DIW passing into drains 570 and 572. Alternatively, valves 551, 560 and 568 may be activated to allow flows 610 and 612 of DIW along a path in the direction of gravity $\vec{g}$ and exit to drain 549 This is undertaken in the absence of a vacuum. After substrate 64 is completely submerged with DIW, pump 570 is activated to remove DIW. In a similar manner, substrate 64 may be rinsed with IPA from supplies by activation of valves 558 and 566.

Figure 13:
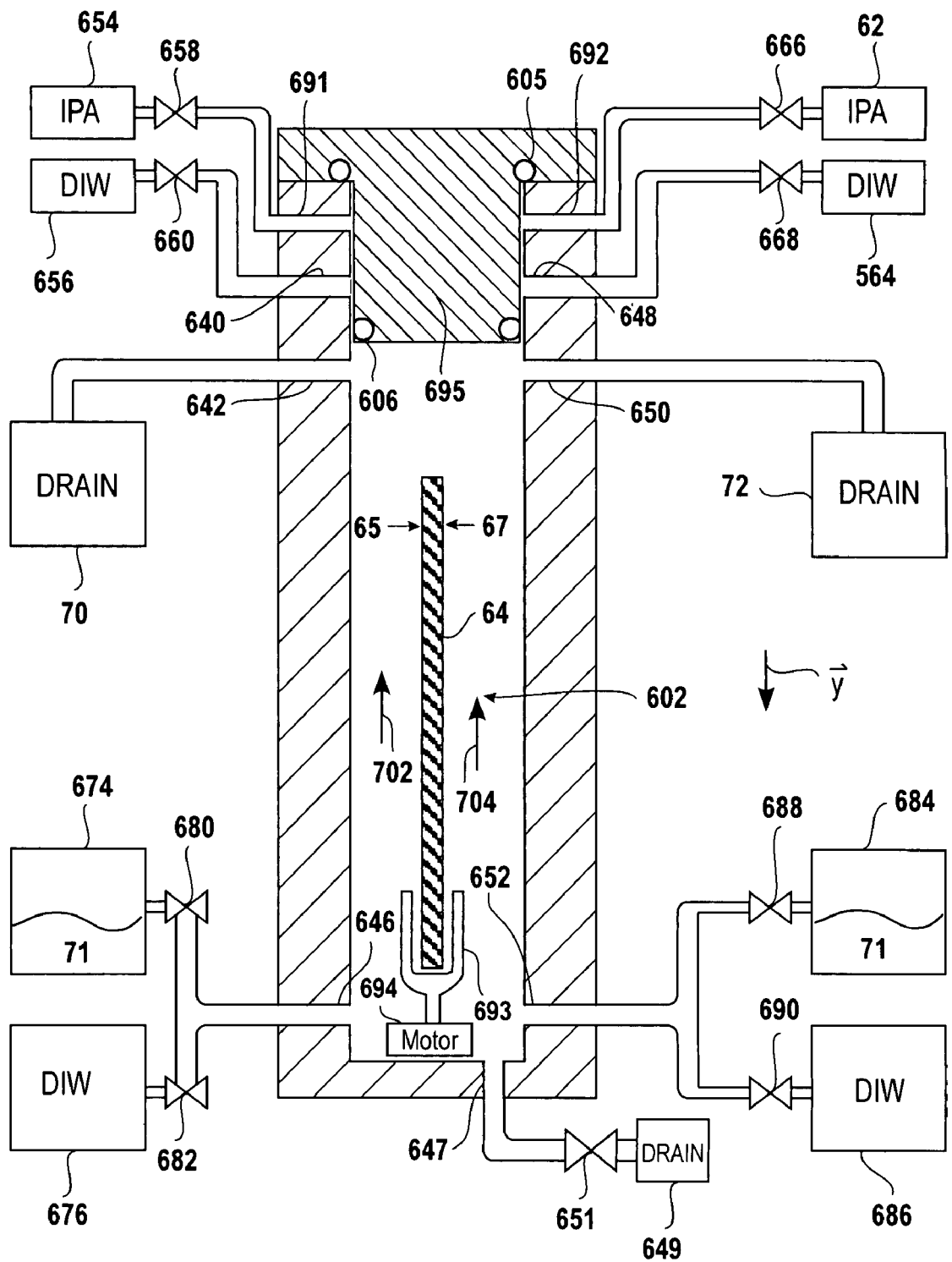
FIG. 13 is an alternate embodiment of one of the immersion tank shown in FIG. 11.

Referring to FIGS. 12 and 13, in accordance with another embodiment of the present invention, another embodiment of immersion tank 502 is shown as immersion tank 602 in which a body 607 throughways, 642, 644, 646, 647, 650, 652, drains 649, 670, 672, supplies 674, 676, 684, 686 and valves 680, 682, 688 and 649 provide the same functions provided by body 507 throughways 542, 544, 546, 547, 550 and 552, drains 570, 572, supplies 574, 576, 584, 586 and valves 580, 582, 588 and 549, respectively. In addition, immersion tank 602 has formed into body 607 two additional throughways 691 and 692 that allow access to immersion tank by IPA from supply 654 and 662, respectively. Specifically, valve 658 allows selectively access of IPA from supply 654 to immersion tank 602, valve 666 allows selectively access of IPA from supply 662 to immersion tank 602. Valve 660 allows selectively access of DIW from supply 656 to immersion tank 602, and valve 668 allows selectively access of DIW from supply 664 to immersion tank 602. In addition, a support 693 upon which substrate 64 rests is coupled to a motor 694 to allow varying a distance between substrate 64 and throughway 647. Lid 603 includes two sets of O-rings 605 and 606. O-ring 605 functions in the manner as O-ring 605. O-ring 606, on the other hand is positioned at an end of a stopper portion 695 of lid 603 positioned between throughways 540, 548 and throughways 542 and 550. In this configuration, throughways 691, 692, 640 and 648 are isolated from fluid flow exiting throughways 546 and 552 when valve 551 prevents flow to drain 549, i.e., a fluid-tight seal if formed between both throughways 642 and 650 and the throughways 691, 692, 640 and 648.

Referring to FIG. 13, in one manner of operation, substrate 64 is present placed in immersion tank 602 in the absence of solution 71. One or both of valves 680 and 688 are activated, under control of processor 416 to generate a flow of solution into immersion tank 602 through throughways 646 and 652, respectively. valve 551 is deactivated to prevent flow of solution 71 into drain 549. As a result, flows 700 and 702 of solution 71 are generated that move in a direction opposite to gravity $\vec{g}$ so as to pass adjacent to opposed surfaces 65 and 67 of substrate 64, with solution exiting immersion tank 602 by passing into throughways 642 and 650 onto drains 670 and 672, respectively.

Figure 14:
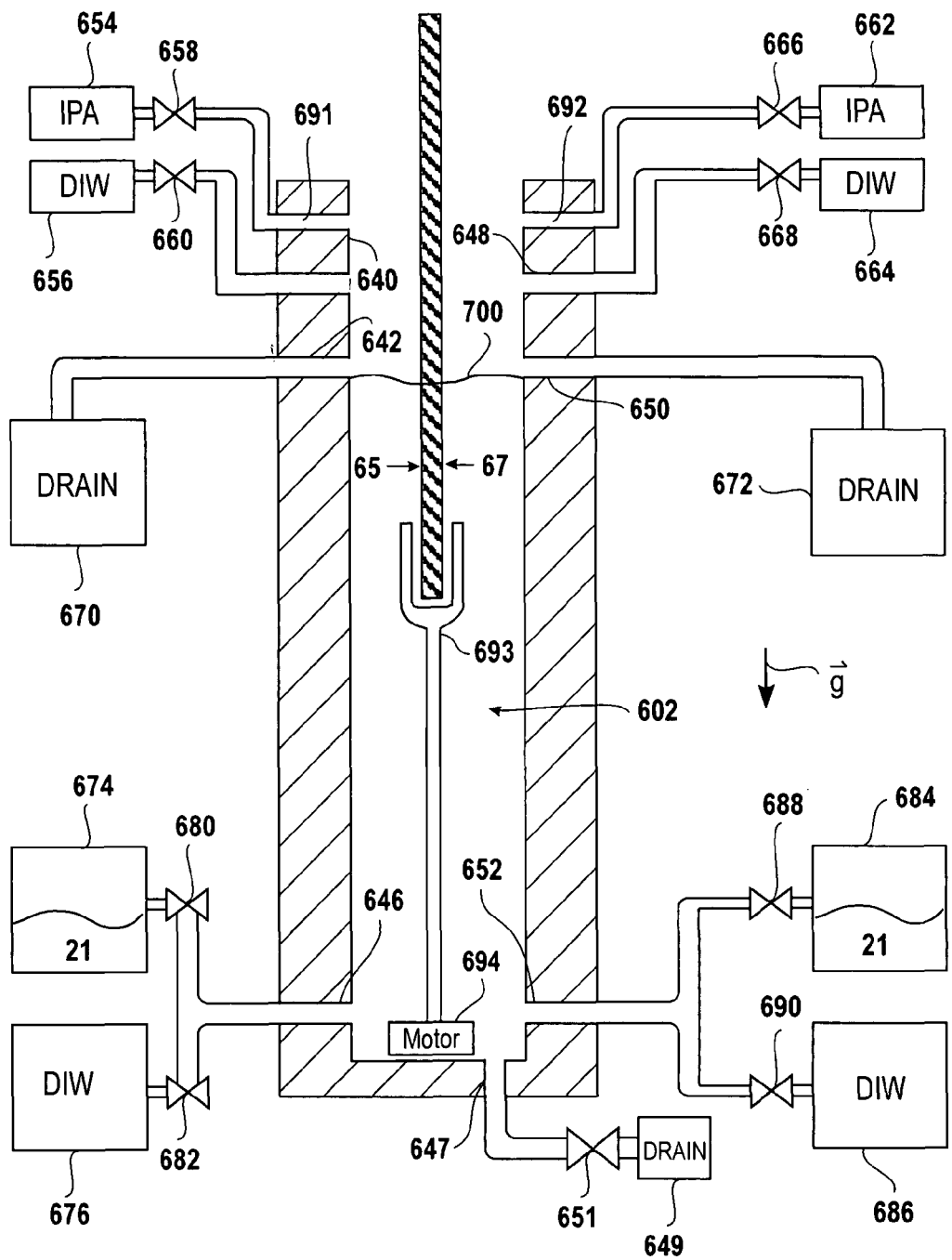
FIG. 14 a cross-section of the immersion tank shown in FIG. 13 with a lid removed.

Referring to both FIGS. 13 and 14, after exposure to a sufficient quantity of solution 71 surfaces 65 and 67 are rinsed by exposure to one or more of IPA and/or DIW. Specifically lid 601 is removed to place expose throughways 691, 692, 540 and 548 in fluid communication with throughways 542 and 550. Valves 658 and 666 are activated to generate a flow of IPA under force of gravity $\vec{g}$ that results in the formation of a meniscus 700 where solution 71 contacts IPA and air in immersion tank 602. During the flow of IPA from both throughways 691 and 692 motor 694 operates to move holder 693 and lift substrate 64 out of immersion tank 602. As a result, solution 71 is removed from substrate 64 as the same exits immersion tank.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention. In the claims, elements and/or steps do not imply any particular order of operation, unless explicitly stated in the claims.

In one embodiment, the memory stores computer-readable instructions to be operated on by the processor, wherein the computer-readable instructions include a first set of code to control said carrier sub-system and place said substrate in the tank and a second set of code to control the solution handling sub-system.

In one embodiment, the computer-readable instructions further include a first sub-routine to control said solution handling system to terminate said spaced-apart flows and fill said tank with said solution and a second sub-routine to control said carrier sub-system to remove said substrate from said tank.

In one embodiment, the computer-readable instructions further include a first sub-routine to control said solution handling system to fill said tank with said solution.

In one embodiment, the computer-readable instructions further include a sub-routine to fill said tank with a quantity of said solution and terminate said spaced-apart flows.

What is claimed is:

1. A method for cleaning a substrate having opposed surfaces, one of which includes contaminants thereon, said method comprising:

placing the substrate in an immersion tank filled with a solution;

generating relative movement between the solution and said substrate in a direction transverse to a normal to one of said opposed surfaces to create two spaced-apart flows while introducing and removing the substrate from said immersion tank, and activating one or more first valves that generate a first flow each of said spaced-apart flows moving in a common direction, said solution having coupling elements entrained therein and said relative movement imparting sufficient drag upon a subset of said coupling elements to create movement of the coupling elements of said subset within said solution and impart a quantity of said drag upon said contaminant to cause said contaminant to move with respect to said substrate, said coupling elements having a hardness that is less than a hardness on a surface of said substrate; and reversing a direction of said spaced-apart flows, while deactivating the one or more first valves and activating one or more second valves that generate a second flow which is reversed from the first flow wherein a processor is in data communication with a solution delivery subsystem, a carrier sub-system, and a housing assembly to control the placing of the substrate, wherein a memory is in data communication with said processor, wherein said memory stores computer-readable instructions to be operated on by said processor, said computer-readable instructions including a first set of code to control said carrier sub-system and place said substrate in said tank and a second set of code to control said solution delivery sub-system.

2. The method as recited in claim 1 wherein said two spaced-apart flows move concurrently about said substrate.

3. The method as recited in claim 1 wherein generating further includes imparting upon the coupling elements of said subset with sufficient momentum so that the coupling elements of said subset contact said contaminant and cause said contaminant to move with respect to said substrate.

4. The method for cleaning a substrate as recited in claim 1, further comprising:

exposing said substrate to a flow of deionized water (DIW) followed by isopropyl alcohol (IPA) during the removing of the substrate from the immersion tank, such that the solution is removed from the surface of the substrate.

5. A method for cleaning a plurality of substrates having opposed surfaces, at least one of which includes contaminants thereon, said method comprising:

concurrently generating relative movement between a plurality of substrates and a solution by exposing a cassette having said plurality of substrates contained therein to said solution, with said solution having coupling elements entrained therein and said relative movement imparting sufficient drag upon a subset of said coupling elements to create movement of the coupling elements of said subset within said solution and impart a quantity of said drag upon said contaminants to cause said contaminants to move with respect to said substrate, said coupling elements having a hardness that is less than a hardness on a surface of the plurality of substrates, wherein concurrently generating includes, placing said cassette into a tank in an absence of solution in the tank;

introducing said solution into said tank to generate the relative movement between said solution and surfaces of said plurality of substrates along a first direction with a sufficient quantity of said solution being introduced to produce a volume of said solution in said tank sufficient to submerge each of said plurality of substrates in said volume, wherein introducing said solution further includes, activating one or more first valves to generate a first flow of solution into the tank;

deactivating the one or more first valves; and activating one or more second valves to generate a second flow of solution into the tank, wherein the second flow is reversed from the first flow; and removing said cassette from said volume to generate relative movement between said surfaces in a second direction opposite to said first direction.

6. The method as recited in claim 1, wherein the substrate is in a cassette having a plurality of substrates when the substrate is placed in the immersion tank.

7. The method as recited in claim 1, wherein said computer-readable instructions further includes a first sub-routine to control said solution handling system to terminate said spaced-apart flows and fill said tank with said solution and a second sub-routine to control said carrier sub-system to remove said substrate from said tank.

8. The method as recited in claim 7, wherein said computer-readable instructions further includes a first sub-routine to control said solution handling system to fill said tank with said solution.

9. The method as recited in claim 7, wherein said computer-readable instructions further includes a sub-routine to fill said tank with a quantity of said solution and terminate said spaced-apart flows.

10. The method as recited in claim 5, wherein placing said cassette and introducing said solution are performed by a computer program when executed by one or more processors, the computer program being embedded in a non-transitory computer-readable storage medium.

11. The method as recited in claim 5, wherein the first flow and the second flow move in a direction substantially parallel to a direction of gravity.

12. The method as recited in claim 5, further including producing, from said solution, foam, with the first flow and the second flow consisting of said foam.

13. The method as recited in claim 12, further including:

terminating the first flow and the second flow;

exposing said substrate to a solution to remove said foam; and exposing said substrate to a vacuum to remove said solution.

14. A method for cleaning a plurality of substrates having opposed surfaces, at least one of which includes contaminants thereon, said method comprising:

concurrently generating relative movement between a plurality of substrates and a solution by exposing a cassette having said plurality of substrates contained therein to said solution, with said solution having coupling elements entrained therein and said relative movement imparting sufficient drag upon a subset of said coupling elements to create movement of the coupling elements of said subset within said solution and impart a quantity of said drag upon said contaminants to cause said contaminants to move with respect to said substrate, and said coupling elements having a hardness that is less than a hardness on a surface of the plurality of substrates, wherein concurrently generating includes, activating one or more first valves to generate a first flow to fill a tank with said solution;

inserting said cassette into said tank to generate the relative movement between surfaces of said plurality of substrates and said solution along a first direction;

alternatively moving a shelf holding said cassette along the first direction and along a second direction opposite to said first direction;

activating one or more second valves to generate a second flow of solution into the tank, wherein the second flow is reversed from the first flow; and removing said cassette from said tank to generate relative movement between said surfaces.

15. The method as recited in claim 14, wherein placing said cassette and introducing said solution are performed by a computer program when executed by one or more processors, the computer program being embedded in a non-transitory computer-readable storage medium.

16. The method as recited in claim 14, wherein the first flow and the second flow move in a direction substantially parallel to a direction of gravity.

17. The method as recited in claim 14, further including producing, from said solution, foam, with the first flow and the second flow consisting of said foam.

18. The method as recited in claim 17, further including:
terminating the first flow and the second flow;
exposing said substrate to a solution to remove said foam; and
exposing said substrate to a vacuum to remove said solution.

\* \* \* \* \*